(12) United States Patent
Saito

(10) Patent No.: US 8,283,396 B2
(45) Date of Patent: Oct. 9, 2012

(54) CURABLE FLUORINE-CONTAINING POLYETHER COMPOSITION

(75) Inventor: Satoru Saito, Ibaraki (JP)

(73) Assignee: Unimatec Co., Ltd., Tokyo (JP)

( * ) Notice: Subject to any disclaimer, the term of this patent is extended or adjusted under 35 U.S.C. 154(b) by 0 days.

(21) Appl. No.: 13/262,331

(22) PCT Filed: Feb. 26, 2010

(86) PCT No.: PCT/JP2010/053112
§ 371 (c)(1),
(2), (4) Date: Sep. 30, 2011

(87) PCT Pub. No.: WO2010/116813
PCT Pub. Date: Oct. 14, 2010

(65) Prior Publication Data
US 2012/0029147 A1 Feb. 2, 2012

(30) Foreign Application Priority Data
Apr. 9, 2009 (JP) .................. 2009-094890

(51) Int. Cl.
C08K 5/1525 (2006.01)
C07C 239/00 (2006.01)
(52) U.S. Cl. .................. 524/108; 549/213; 564/155
(58) Field of Classification Search .................. 524/108; 564/155; 549/213
See application file for complete search history.

(56) References Cited

U.S. PATENT DOCUMENTS

| 4,356,291 | A | 10/1982 | Darling |
| 6,294,627 | B1 | 9/2001 | Worm et al. |
| 6,307,087 | B1 | 10/2001 | Buchwald et al. |
| 7,977,510 | B2 * | 7/2011 | Saito .................. 564/155 |
| 8,044,221 | B2 * | 10/2011 | Saito .................. 549/213 |

FOREIGN PATENT DOCUMENTS

| JP | 57-175185 | | 10/1982 |
| JP | 2009-001709 | | 1/2009 |
| JP | 2009-001771 | * | 1/2009 |
| JP | 2009-019149 | | 1/2009 |
| JP | 2009-029877 | | 2/2009 |
| JP | 2009-173780 | | 8/2009 |
| JP | 2010-064962 | | 3/2010 |
| WO | WO 2008/126436 A1 | | 10/2008 |
| WO | WO 2009/142085 A1 | | 11/2009 |

OTHER PUBLICATIONS

International Search Report from corresponding PCT application No. PCT/JP2010/053112 Apr. 27, 2010, 4 pgs.
Miyaura, Norio, et al., "Palladium-Catalyzed Cross-Coupling Reactions of Organoboron Compounds", Chem.Rev., vol. 95, 1995, pp. 2457-2483.
Morgan, Alexander B., et al., "Synthesis, Flame-Retardancy Testing, and Preliminary Mechanism Studies of Nonhalogenated Aromatic Boronic Acids: A New Class of Condensed-Phase Polymer Flame-Retardant Additives for Acrylonitrile-Butadiene-Styrene and Polycarbonate", Journal of Applied Polymer Science, vol. 76, Issue 8, May 23, 2000, pp. 1257-1268.
English translation of International Preliminary Report on Patentability and Written Opinion from corresponding PCT application No. PCT/JP2010/053112 dated Nov. 24, 2011 (6 pgs).

* cited by examiner

Primary Examiner — Mark Eashoo
Assistant Examiner — John Uselding
(74) Attorney, Agent, or Firm — Brinks Hofer Gilson & Lione

(57) ABSTRACT

Disclosed is a curable fluorine-containing polyether composition comprising (A) 100 parts by weight of a fluorine-containing polyether compound of the formula:

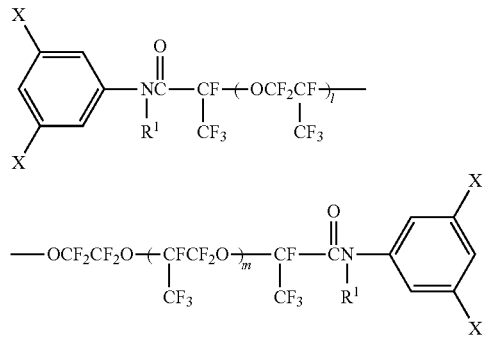

wherein $R^1$ is a hydrogen atom, a $C_1$-$C_3$ alkyl group, or a phenyl group, X is a bromine or iodine atom, l and m are integers of 10 or more, and l+m is 30 to 200; (B) 1 to 20 parts by weight of a fluorine-containing aromatic boronic acid ester compound of the formula:

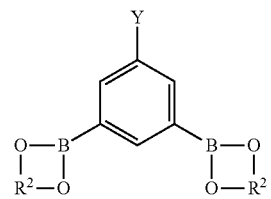

wherein $R^2$ is a $C_2$-$C_{10}$ divalent aliphatic hydrocarbon group, and Y is a $C_1$-$C_{20}$ fluoroalkyl group; (C) 0.0001 to 1 parts by weight of a zero-valent or divalent organopalladium compound; (D) 0.5 to 10 parts by weight of a basic inorganic or organic compound; and (E) 0 to 5 parts by weight of an organophosphorus compound. The curable fluorine-containing polyether composition can produce a cured product that has improved compression set characteristics.

10 Claims, No Drawings

CURABLE FLUORINE-CONTAINING POLYETHER COMPOSITION

RELATED APPLICATION

This application is a 35 U.S.C. §371 national phase filing of International Patent Application No. PCT/JP2010/053112, filed Feb. 26, 2010, through which and to which priority is claimed under 35 U.S.C. §119 to Japanese Patent Application No. 2009-094890, filed Apr. 9, 2009.

TECHNICAL FIELD

The present invention relates to a curable fluorine-containing polyether composition. More particularly, the present invention relates to a curable fluorine-containing polyether composition that can improve the compression set characteristics of a cured product.

BACKGROUND ART

As a fluorine-containing polyether compound that can produce a cured product having excellent heat resistance, low-temperature characteristics, and moldability, the present inventor has previously proposed a fluorine-containing polyether compound represented by the general formula:

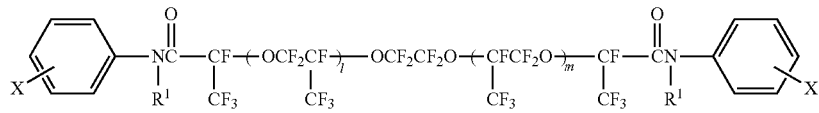

wherein $R^1$ is a hydrogen atom, an alkyl group having 1 to 3 carbon atoms, or a phenyl group, X is an iodine or bromine atom, the substitution position of X in the phenyl group is the m- or p-position with respect to the $NR^1$ group, l and m are each independently an integer of 10 or more, and l+m is 30 to 130 (Patent Document 1).

The above compound can be cured with 1,3,5-tris(4,4,5,5-tetramethyl-1,3,2-dioxaborolan-2-yl)benzene of the formula:

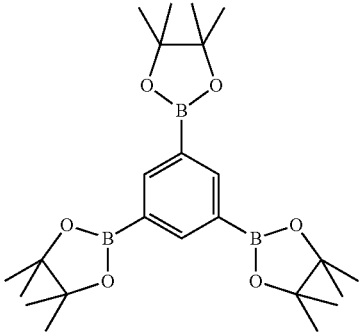

and an organopalladium compound catalyst. However, the aforementioned aromatic triboronic acid ester compound has a high melting point and a low compatibility with the fluorine-containing polyether compound; therefore, the compression set characteristics after curing are sometimes not satisfactory.

PRIOR ART DOCUMENT

Patent Document
Patent Document 1: WO 2008/126436 A1
Patent Document 2: U.S. Pat. No. 6,307,087
Patent Document 3: U.S. Pat. No. 6,294,627
Non-Patent Document
Non-Patent Document 1: Chem. Rev., vol. 95, pp. 2457 (1995)
Non-Patent Document 2: J. Appl. Poly. Sci., vol. 76, pp. 1257 (2000)

OUTLINE OF THE INVENTION

Problem to be Solved by the Invention

An object of the present invention is to provide a curable fluorine-containing polyether composition that can improve the compression set characteristics of a cured product.

Means for Solving the Problem

The above object of the present invention can be achieved by a curable fluorine-containing polyether composition comprising:

(A) 100 parts by weight of a fluorine-containing polyether compound represented by the general formula:

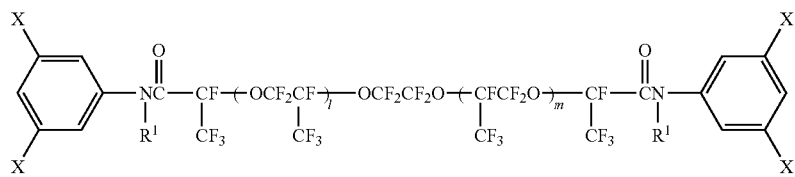

wherein $R^1$ is a hydrogen atom, an alkyl group having 1 to 3 carbon atoms, or a phenyl group, X is a bromine or iodine atom, l and m are each independently an integer of 10 or more, and l+m is 30 to 200;

(B) 1 to 20 parts by weight of a fluorine-containing aromatic boronic acid ester compound represented by the general formula:

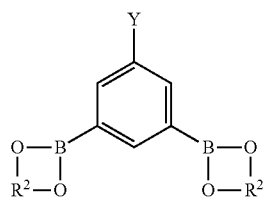

wherein $R^2$ is a linear or branched divalent aliphatic hydrocarbon group having 2 to 10 carbon atoms, and Y is a fluoroalkyl group having 1 to 20 carbon atoms, which optionally has an ether bond or an amide bond at any position of the chain thereof;

(C) 0.0001 to 1 part by weight of a zero-valent or divalent organopalladium compound;

(D) 0.5 to 10 parts by weight of a basic inorganic compound or a basic organic compound; and (E) 0 to 5 parts by weight of an organophosphorus compound.

Effect of the Invention

The curable fluorine-containing polyether composition of the present invention has excellent processability (e.g., moderate fluidity at room temperature), and can be applied to various molding methods, such as injection molding and RIM. Moreover, a molded product obtained by curing the composition of the present invention not only has excellent compression set characteristics, but also has excellent chemical resistance, low-temperature characteristics, heat resistance, etc. Hence, the molded product can be suitably used for various applications including, for example, automotive fuel supply system sealing materials, oil sealing materials, airplane fuel system and hydraulic system sealing materials, and sealing materials for semiconductor manufacturing devices.

EMBODIMENTS FOR CARRYING OUT THE INVENTION

The curable composition of the present invention comprises the above fluorine-containing polyether compound [Component (A)] as a main component, and other components described below:

Component (A): Fluorine-containing polyether compound
100 parts by weight
Component (B): Fluorine-containing aromatic boronic acid ester compound
1 to 20 parts by weight
Component (C): Zero-valent or divalent organopalladium compound
0.0001 to 1 part by weight
Component (D): Basic inorganic compound or basic organic compound
0.5 to 10 parts by weight
Component (E): Organophosphorus compound
0 to 5 parts by weight The curing reaction of the curable composition is based on the cross-coupling reaction of arylboronic acids or esters thereof with aryl halides using a palladium catalyst (Suzuki-Miyaura reaction; see Non-Patent Document 1).

Examples of each component are sequentially described below.

In the fluorine-containing polyether compound as Component (A) of the general formula:

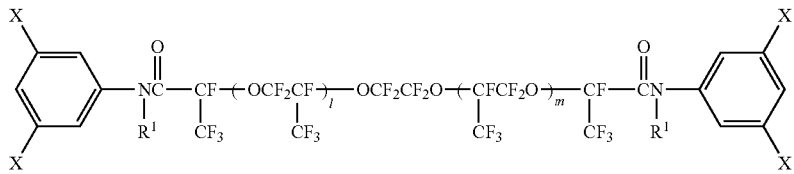

which is the main component of the curable fluorine-containing polyether composition of the present invention, $R^1$ is a hydrogen atom, an alkyl group having 1 to 3 carbon atoms, or a phenyl group. However, in order to avoid intramolecular or intermolecular hydrogen bonding and side reactions during curing, an alkyl group having 1 to 3 carbon atoms or a phenyl group is preferred; particularly, a methyl group is selected in terms of ease of production. X is either an iodine atom or a bromine atom. l and m are each independently an integer of 10 or more, and l+m is an integer of 30 to 200. In view of the mechanical strength of the cured product, l+m is preferably 50 to 200.

Specific examples of the fluorine-containing polyether compound include the following compounds:

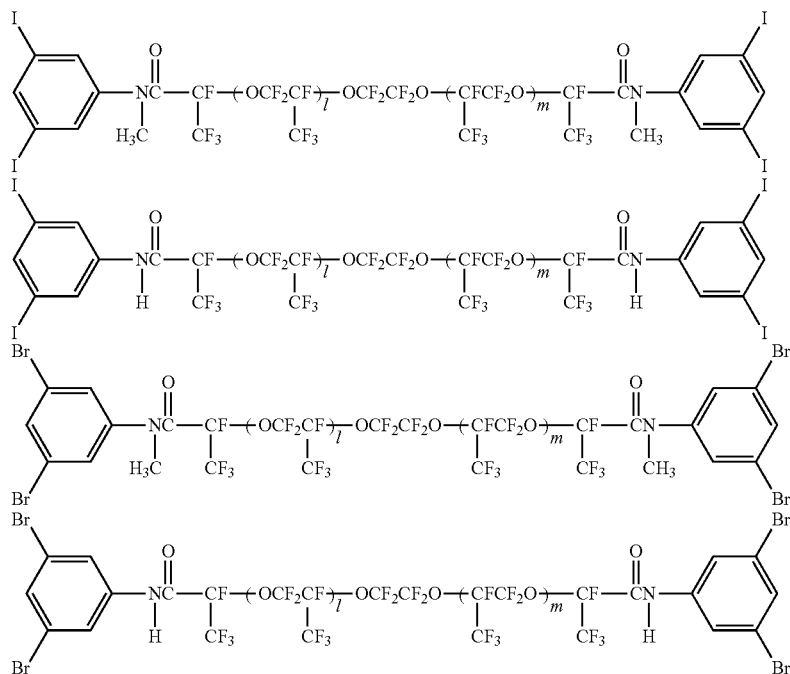

In addition, such a fluorine-containing polyether compound can be produced through the following series of steps:

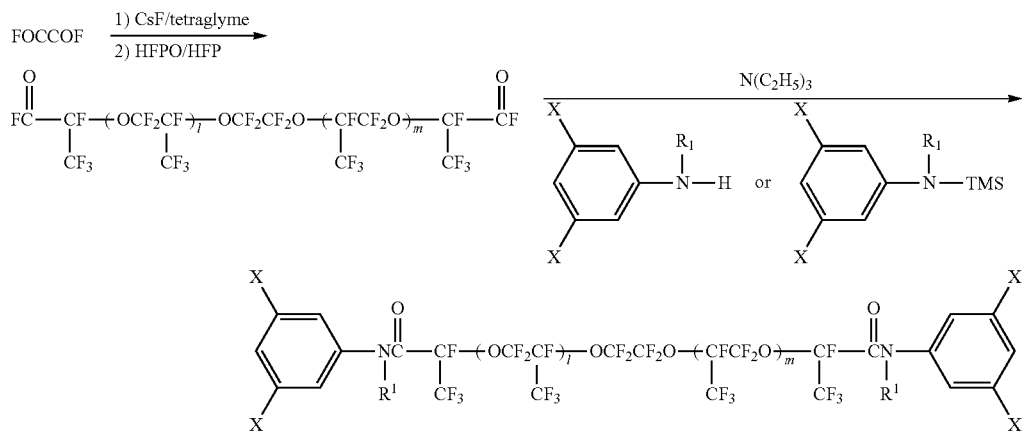

Notes: TMS = trimethylsilyl group

In the curable composition of the present invention, a fluorine-containing aromatic boronic acid ester compound represented by the following general formula is used as the curing agent (Component (B)):

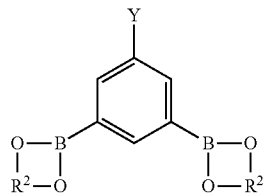

In the formula, Y is a fluoroalkyl group having 1 to 20 carbon atoms, which optionally has an ether bond or an amide bond at any position of the chain thereof. Moreover, the fluoroalkyl group may be a perfluoroalkyl group.

More specifically, a fluorine-containing aromatic boronic acid ester compound having an amide bond and represented by the following general formula can be used.

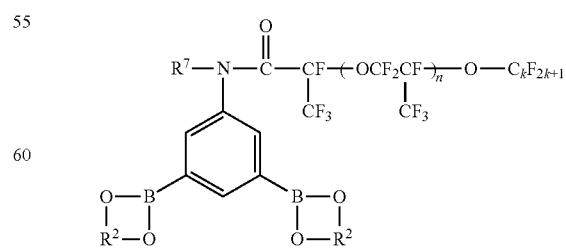

In the formula, $R^2$ is a linear or branched divalent aliphatic hydrocarbon group having 2 to 10 carbon atoms. Examples thereof include —CH$_2$C(CH$_3$)$_2$CH$_2$—, —CH$_2$CH$_2$CH$_2$—, —C(CH$_3$)$_2$C(CH$_3$)$_2$—, —CH(CH$_3$)CH$_2$C(CH$_3$)$_2$—, etc.; particularly, —C(CH$_3$)$_2$C(CH$_3$)$_2$— is selected in terms of ease of production. R$^7$ is a hydrogen atom, an alkyl group having 1 to 3 carbon atoms, or a phenyl group; however, in order to avoid side reactions during curing, an alkyl group having 1 to 3 carbon atoms or a phenyl group is preferable, and a methyl group is particularly selected in terms of ease of production. n is an integer of 0 to 4, and k is an integer of 1 to 3.

Specific examples of the fluorine-containing aromatic boronic acid ester compound include the following compounds:

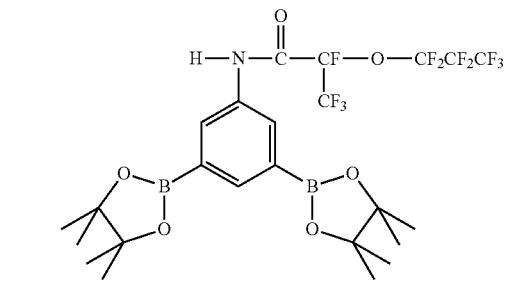

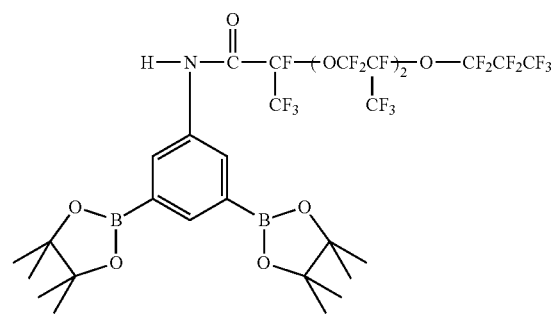

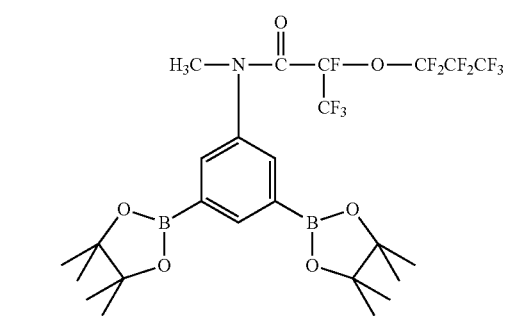

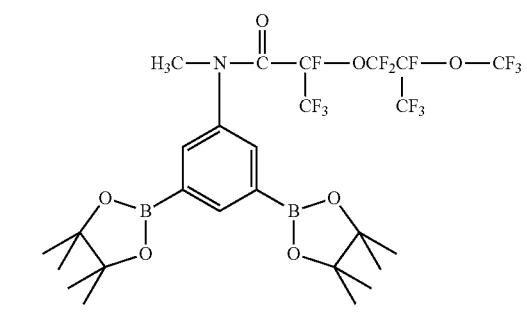

-continued

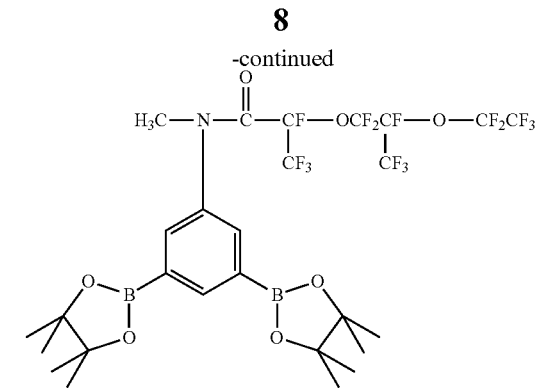

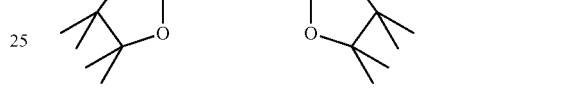

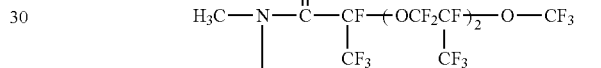

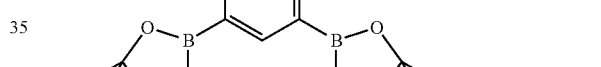

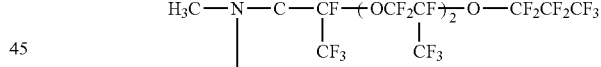

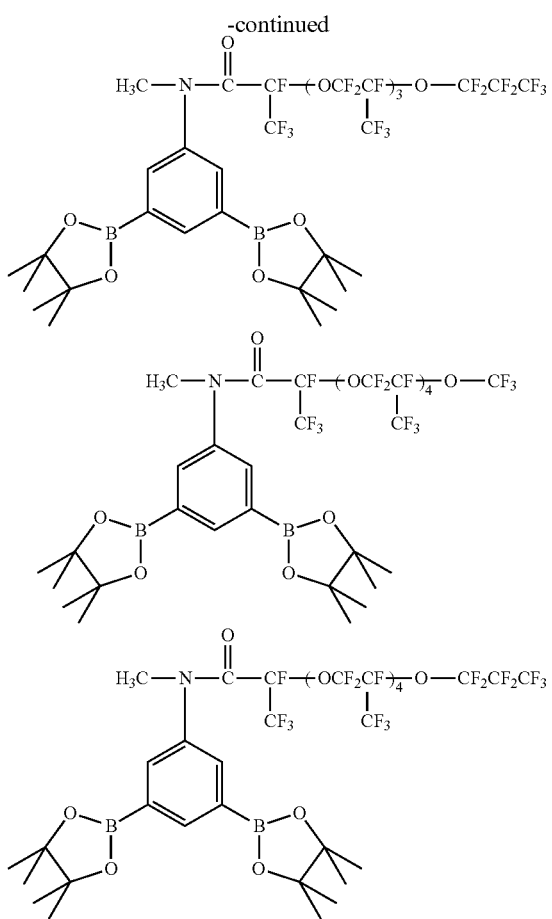

Such a fluorine-containing aromatic boronic acid ester compound having an amide bond can be produced by, for example, the following reaction:

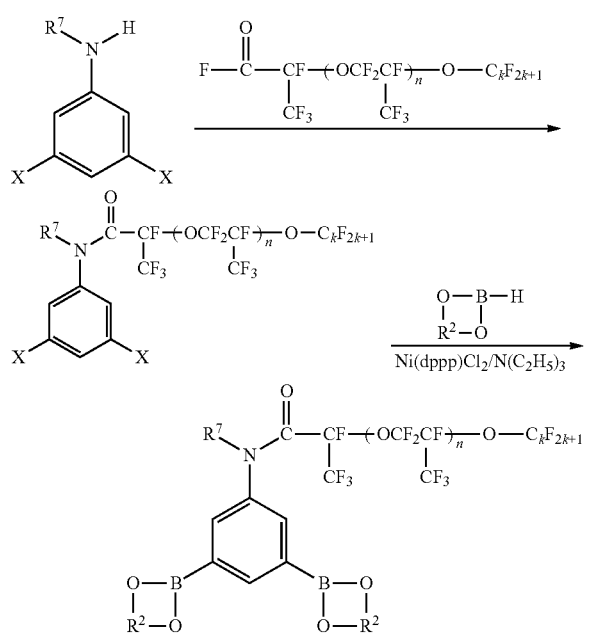

Notes: Ni(dppp)Cl₂ = [1,3-bis(diphenylphosphino)propane]dichloronickel

Additionally, as the fluorine-containing aromatic boronic acid ester compound as Component (B) of the curable composition of the present invention, a compound represented by the following general formula can also be used.

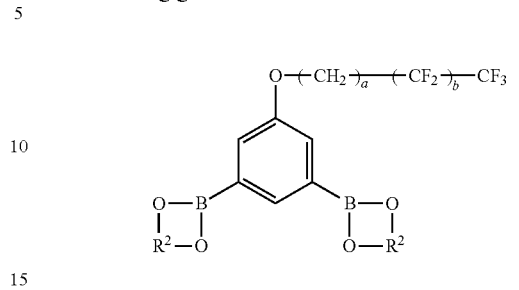

In the formula, $R^2$ is a linear or branched divalent aliphatic hydrocarbon group having 2 to 10 carbon atoms. Examples thereof include $-CH_2C(CH_3)_2CH_2-$, $-CH_2CH_2CH_2-$, $-C(CH_3)_2C(CH_3)_2-$, $-CH(CH_3)CH_2C(CH_3)_2-$, etc.; particularly, $-C(CH_3)_2C(CH_3)_2-$ is selected in terms of ease of production. a is an integer of 1 to 5, preferably 1 to 3 particularly when heat resistance is required. Moreover, b is an integer of 3 to 7, preferably 3 to 5.

Specific examples thereof include the following compounds:

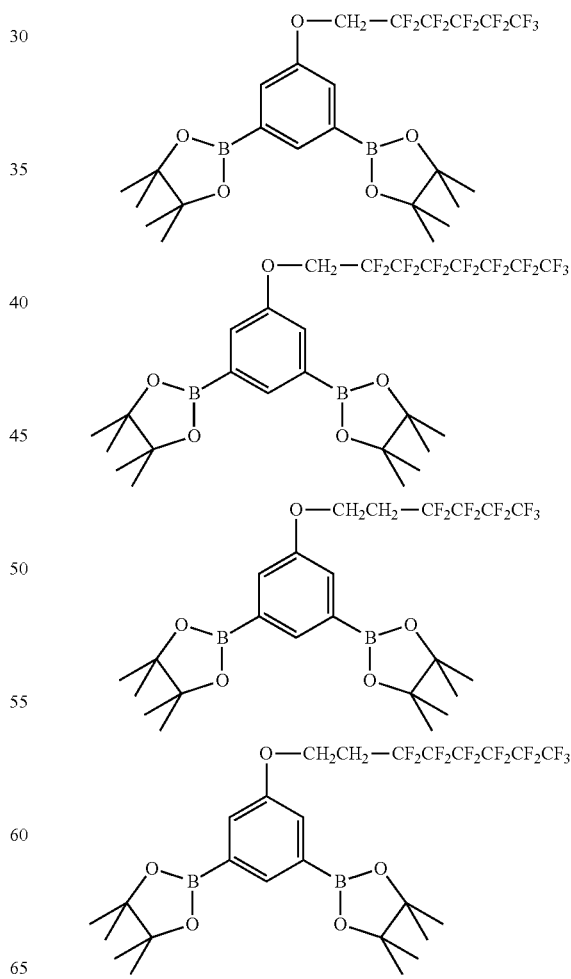

-continued

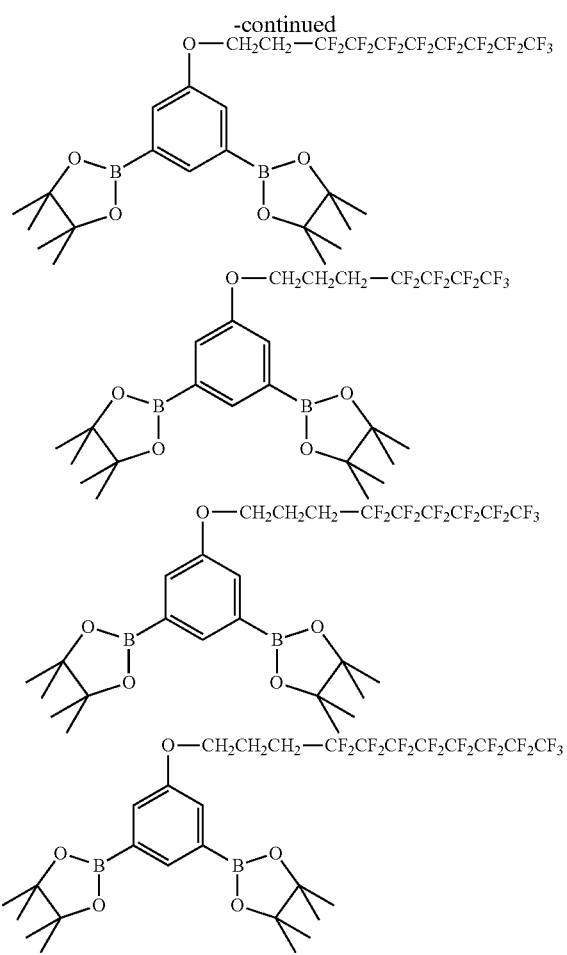

Such a fluorine-containing aromatic boronic acid ester compound can be produced by, for example, the following reaction (see Non-Patent Document 2):

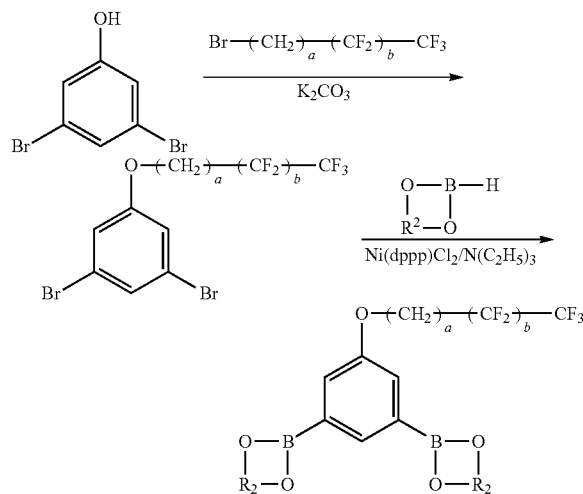

The aromatic boronic acid ester compound as Component (B) is used in an amount of 1 to 20 parts by weight, preferably 1 to 10 parts by weight, based on 100 parts by weight of the fluorine-containing polyether compound as Component (A). When the amount of Component (B) used is less than this range, curing is insufficient or the mechanical strength of the resulting cured product is lower. In contrast, an amount higher than this range is not economical because an effect corresponding to the amount of use cannot be expected.

As the organopalladium compound as Component (C), which is used as a curing catalyst, a zero-valent or divalent organopalladium compound is used. A zero-valent organopalladium compound acts as a catalyst for the curing reaction in the zero-valent state as it is. A divalent organopalladium compound develops catalytic action after being reduced to a zero-valent compound by Component (B) or an organophosphorus compound as Component (E), described later. The organopalladium compound as Component (C) is used in an amount of 0.0001 to 1 parts by weight, preferably 0.001 to 0.5 parts by weight, based on 100 parts by weight of the fluorine-containing polyether compound as Component (A). When the amount of Component (C) used is less than this range, sufficient curing is not performed; whereas an amount higher than this range is not economical.

Examples of zero-valent organopalladium compounds include tetrakis(triphenylphosphine)palladium, bis(dibenzylideneacetone)palladium, tris(dibenzylideneacetone)dipalladium, and the like. Examples of divalent organopalladium compounds include palladium acetate, ally palladium chloride, bis(triphenylphosphine)palladium dichloride, bis(tri-tert-butylphosphine)palladium dichloride, [1,1'-bis(diphenylphosphino)ferrocene]dichloropalladium, and the like. Particularly, palladium acetate is suitably used.

When using an organopalladium compound that does not contain a phosphorus compound in its molecular, such as palladium acetate, bis(dibenzylideneacetone)palladium, tris(dibenzylideneacetone)dipalladium, and allyl palladium chloride, it is preferable to use, as a stabilizer therefor, an organophosphorus compound as Component (E) represented by the general formula:

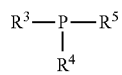

Wherein $R^3$, $R^4$, and $R^5$ are each independently an aliphatic hydrocarbon group having 1 to 10 carbon atoms, an alicyclic hydrocarbon group having 5 to 12 carbon atoms, or an aromatic hydrocarbon group having 6 to 20 carbon atoms, each optionally having a substituted group. Specific examples of the organophosphorus compound having an aliphatic hydrocarbon group include tricyclohexylphosphine, tri-tert-butylphosphine, triisopropylphosphine, and the like.

Moreover, as the organophosphorus compound having an aromatic hydrocarbon group, triphenylphosphine compounds represented by the general formula:

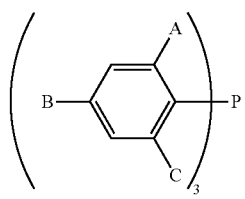

or a compound group, generically called Buchwald ligands, represented by the general formula:

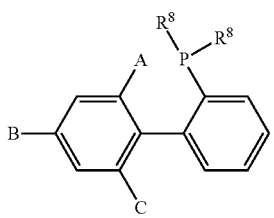

can also be used (see Patent Documents 2 and 3).

In the formula, A, B, and C are each independently a hydrogen atom, an alkyl group having 1 to 5 carbon atoms, an alkoxy group or a dialkylamino group, each an alkyl group having 1 to 3 carbon atoms. $R^8$ is a linear or cyclic aliphatic hydrocarbon group having 1 to 6 carbon atoms. Examples of triphenylphosphine compounds include triphenylphosphine, tris(4-methoxyphenyl)phosphine, tris(1,3,5-triisopropylphenyl)phosphine, and the like. Specific examples of Buchwald ligands include (2-biphenyl)dicyclohexylphosphine, 2-dicyclohexylphosphino-2',6'-dimethoxybiphenyl, 2-di-tert-butylphosphino-2', 4',6'-triisopropylbiphenyl, 2-dicyclohexylphosphino-2'-(N,N-dimethylamino)biphenyl, and other compounds.

Another usable example is a bidentate ligand organophosphorus compound having two phosphorus atoms in its molecular and represented by the general formula:

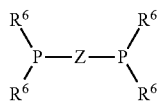

wherein $R^6$ is a phenyl group or an aliphatic hydrocarbon group having 1 to 6 carbon atoms, each optionally having a substituted group, and Z is a divalent aliphatic hydrocarbon group having 2 to 10 carbon atoms, an aromatic hydrocarbon group having 6 to 20 carbon atoms, or a metallocene group.

Specific examples thereof include 1,2-bis(diphenylphosphino)ethane, 1,3-bis(diphenylphosphino)propane, 1,4-bis(diphenylphosphino)butane, 1,1'-bis(diphenylphosphino)ferrocene, 1,1'-bis(di-tert-butylphosphino)ferrocene, 2,2'-bis(diphenylphosphino)-1,1'-binaphthalene, and other compounds.

The organophosphorus compound as Component (E) is used in an amount of 0.5 to 10 molar equivalent, preferably 1 to 4 molar equivalent, with respect to the Pd atom of the organopalladium compound as Component (C). It is preferable to use Component (E) in an amount of 0.01 to 0.5 parts by weight, based on 100 parts by weight of Component (A).

Examples of the basic inorganic compound or basic organic compound as Component (D) include alkali metal carbonates or hydrogen carbonates, such as lithium carbonate, sodium carbonate, potassium carbonate, cesium carbonate, lithium hydrogen carbonate, sodium hydrogen carbonate, and potassium hydrogen carbonate; alkali metal phosphates or hydrogen phosphates, such as lithium phosphate, sodium phosphate, and potassium phosphate; oxides or hydroxides of alkali metals or alkaline earth metals, such as magnesium oxide, calcium hydroxide, and sodium hydroxide; alkali metal fluorides, such as potassium fluoride, sodium fluoride, and cesium fluoride; alkali metal acetates, such as potassium acetate; sodium methoxide; and organic amines. A preferable example is potassium phosphate. The basic inorganic compound or basic organic compound as Component (D) is used in an amount of 0.5 to 10 parts by weight, preferably 1 to 10 parts by weight, based on 100 parts by weight of the fluorine-containing polyether compound as Component (A). When Component (D) is not added, the curing reaction may proceed very slowly, or no curing reaction may occur.

Other than these components, the curable fluorine-containing polyether composition suitably contains various fillers, reinforcing agents, pigments, etc., which are used in amounts that do not inhibit the curing reaction, and whose purity does not inhibit the curing reaction. The composition is prepared by a kneading method using a three-roll mill, a planetary mixer, etc., or a mixing method using a solvent in which mixing is performed in a mixed solvent of, for example, ethanol, water, and 1,3-bis(trifluoromethyl)benzene, and thereafter the mixed solvent is removed. The mixture is cured by compression molding, injection molding, RIM molding, or the like, at room temperature to 200° C. for about 1 to 60 minutes, optionally followed by oven vulcanization (secondary vulcanization) at 50 to 250° C. for about 1 to 30 hours.

EXAMPLES

The following describes the present invention with reference to Examples.

Example 1

A fluorine-containing polyether compound PFPE-Br$_2$ (l+m=100, viscosity at 25° C.: 15 Pa·s; 100 parts by weight) of the general formula:

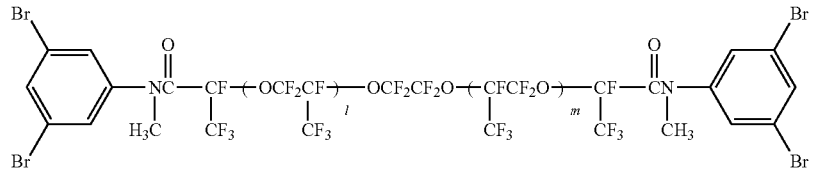

8 parts by weight of a curing agent A of the formula:

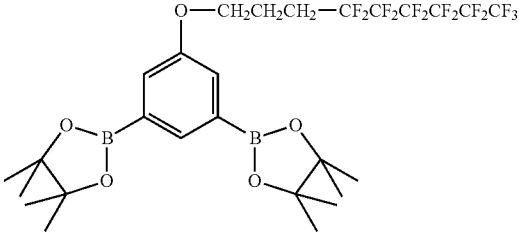

0.032 parts by weight of palladium acetate, 0.073 parts by weight of triphenylphosphine, and 4.8 parts by weight of potassium phosphate were added to a mixed solvent of 125 parts by weight of ethanol, 25 parts by weight of water, and 400 parts by weight of 1,3-bis(trifluoromethyl)benzene. The mixture was mixed under a nitrogen atmosphere at room temperature for 5 minutes. Thereafter, volatile substances were removed at room temperature under reduced pressure. To this mixture, 13 parts by weight of acetylene carbon black was added.

The curable composition obtained in this manner was measured for the curing behavior (values of t10, t90, ML, and MH) at 130° C. for 30 minutes using a Monsanto disk rheometer. The obtained mixture was subjected to compression molding at 130° C. for 15 minutes. Subsequently, secondary vulcanization was sequentially performed at 80° C. for 5 hours and at 240° C. for 15 hours under a nitrogen atmosphere, thereby obtaining a specimen. The specimen was measured for each of the following items.

Normal state physical properties: according to JIS K6250 and K6253, which correspond to ISO 471 and ISO 48, respectively Compression set: according to ASTM D395 Method B; the compression set of a P-24 O ring at 200° C. for 70 hours was measured Glass transition temperature: measured by DSC Solvent immersion test: after cured products were immersed in various solvents at 25° C. for 70 hours, their volume change rates were measured Examples 2

A fluorine-containing polyether compound PFPE-Br$_2$ (l+m=100, viscosity at 25° C.: 15 Pa·s; 100 parts by weight), 7.4 parts by weight of a curing agent B of the formula:

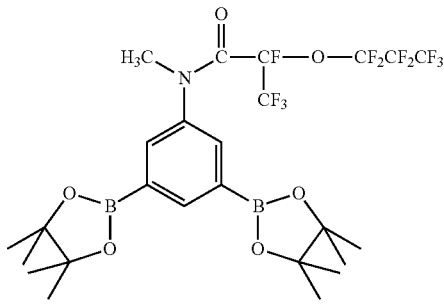

0.033 parts by weight of palladium acetate, 0.076 parts by weight of triphenylphosphine, and 4.9 parts by weight of potassium phosphate were added to a mixed solvent of 125 parts by weight of ethanol, 25 parts by weight of water, and 400 parts by weight of 1,3-bis(trifluoromethyl)benzene. The mixture was mixed at room temperature for 5 minutes under a nitrogen atmosphere. Thereafter, volatile substances were removed at room temperature under reduced pressure. To this mixture, 13 parts by weight of acetylene carbon black was added.

Regarding the curable composition obtained in this manner, the measurement of the curing behavior, the production of a specimen, and the measurement on the specimen were carried out in the same manner as in Example 1.

Comparative Example

A fluorine-containing polyether compound PFPE-I (l+m=86, viscosity at 25° C.: 14 Pa·s; 100 parts by weight) of the general formula:

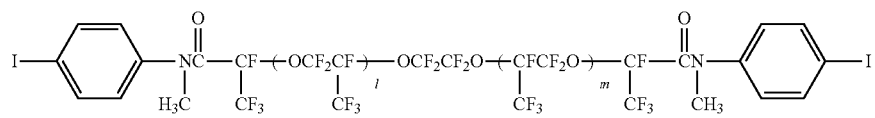

3 parts by weight of a curing agent C of the formula:

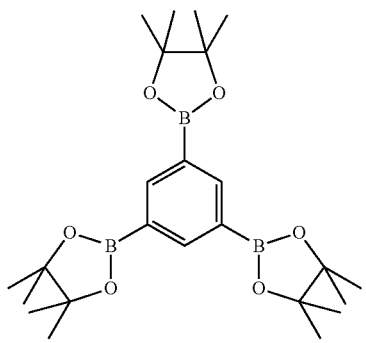

0.15 parts by weight of palladium acetate, 0.46 parts by weight of (2-biphenyl)dicyclohexylphosphine, and 5.6 parts by weight of potassium phosphate were added to a mixed solvent of 125 parts by weight of ethanol, 25 parts by weight of water, and 400 parts by weight of 1,3-bis(trifluoromethyl)benzene. The mixture was mixed at room temperature for 5 minutes under a nitrogen atmosphere. Thereafter, volatile substances were removed at room temperature under reduced pressure. To this mixture, 13 parts by weight of acetylene carbon black was added.

Regarding the curable composition obtained in this manner, the measurement of the curing behavior, the production of a specimen, and the measurement on the specimen (excluding the solvent immersion test) were carried out in the same manner as in Example 1.

The following table shows the measurement results obtained in the Examples and Comparative Example.

TABLE

| Measurement item | | Ex. 1 | Ex. 2 | Comp. Ex. |
| --- | --- | --- | --- | --- |
| [Curing test] | | | | |
| $t_{10}$ | (min.) | 1.5 | 1.2 | 0.5 |
| $t_{90}$ | (min.) | 5.8 | 12.0 | 1.0 |
| ML | (dN·m) | 0.4 | 0.7 | 0.5 |
| MH | (dN·m) | 7.0 | 9.8 | 3.3 |
| [Normal state physical properties] | | | | |
| Hardness | | 67 | 67 | 62 |
| 100% modulus | (MPa) | — | — | 2.0 |
| Strength at break | (MPa) | 2.8 | 3.2 | 3.5 |
| Elongation at break | (%) | 60 | 70 | 290 |

TABLE-continued

| Measurement item | | Ex. 1 | Ex. 2 | Comp. Ex. |
|---|---|---|---|---|
| [Compression set] | | | | |
| 200° C., 70 hours | (%) | 39 | 35 | 84 |
| [Glass transition temperature] | | | | |
| Tg | (° C.) | −55 | −55 | −55 |
| [Solvent immersion test (volume change rate)] | | | | |
| Methanol | (%) | +4 | +4 | — |
| Ethanol | (%) | +1 | +2 | — |
| Toluene | (%) | +4 | +6 | — |
| Acetone | (%) | +12 | +8 | — |
| Isooctane | (%) | +6 | +7 | — |
| 40% KOH aqueous solution | (%) | ±0 | +1 | — |
| 98% sulfuric acid | (%) | +18 | +10 | — |
| 35% hydrochloric acid | (%) | +4 | +3 | — |
| 46% hydrofluoric acid | (%) | — | +4 | — |

The invention claimed is:

1. A curable fluorine-containing polyether composition comprising:

(A) 100 parts by weight of a fluorine-containing polyether compound represented by the general formula:

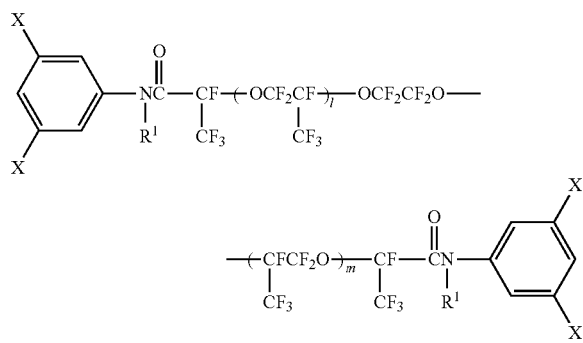

wherein $R^1$ is a hydrogen atom, an alkyl group having 1 to 3 carbon atoms, or a phenyl group, X is a bromine or iodine atom, l and m are each independently an integer of 10 or more, and l+m is 30 to 200;

(B) 1 to 20 parts by weight of a fluorine-containing aromatic boronic acid ester compound represented by the general formula:

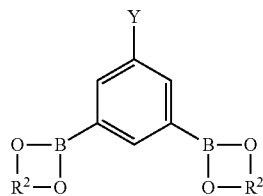

wherein $R^2$ is a linear or branched divalent aliphatic hydrocarbon group having 2 to 10 carbon atoms, and Y is a fluoroalkyl group having 1 to 20 carbon atoms, which optionally has an ether bond or an amide bond at any position of the chain thereof:

(C) 0.0001 to 1 parts by weight of a zero-valent or divalent organopalladium compound;

(D) 0.5 to 10 parts by weight of a basic inorganic compound or a basic organic compound; and (E) 0 to 5 parts by weight of an organophosphorus compound represented by the general formula:

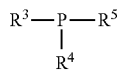

wherein $R^3$, $R^4$, and $R^5$ are each independently an aliphatic hydrocarbon group having 1 to 10 carbon atoms, an alicyclic hydrocarbon group having 5 to 12 carbon atoms, or an aromatic hydrocarbon group having 6 to 20 carbon atoms, each optionally having a substituted group; or by the general formula:

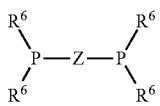

wherein $R^6$ is a phenyl group or an aliphatic hydrocarbon group having 1 to 6 carbon atoms, each optionally having a substituted group, and Z is a divalent aliphatic hydrocarbon group having 2 to 10 carbon atoms, an aromatic hydrocarbon group having 6 to 20 carbon atoms, or a metallocene group.

2. The curable fluorine-containing polyether composition according to claim 1, wherein the fluorine-containing aromatic boronic acid ester compound as Component (B) is a compound having an amide bond and represented by the general formula:

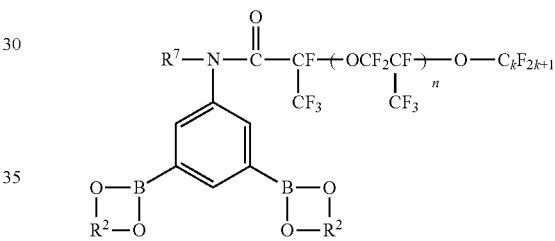

wherein $R^2$ is a linear or branched divalent aliphatic hydrocarbon group having 2 to 10 carbon atoms, $R^7$ is a hydrogen atom, an alkyl group having 1 to 3 carbon atoms, or a phenyl group, n is an integer of 0 to 4, and k is an integer of 1 to 3.

3. The curable fluorine-containing polyether composition according to claim 2, wherein in the fluorine-containing aromatic boronic acid ester compound, $R^2$ is —C(CH$_3$)$_2$C(CH$_3$)$_2$—.

4. The curable fluorine-containing polyether composition according to claim 2, wherein the fluorine-containing aromatic boronic acid ester compound $R^7$ is a methyl group.

5. The curable fluorine-containing polyether composition according to claim 1, wherein the fluorine-containing aromatic boronic acid ester compound as Component (B) is a compound represented by the general formula:

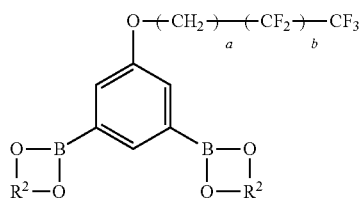

wherein $R^2$ is a linear or branched divalent aliphatic hydrocarbon group having 2 to 10 carbon atoms, a is an integer of 1 to 5, and b is an integer of 3 to 7.

6. The curable fluorine-containing polyether composition according to claim 5, wherein in the fluorine-containing aromatic boronic acid ester compound, $R^2$ is —C(CH$_3$)$_2$C(CH$_3$)$_2$—.

7. The curable fluorine-containing polyether composition according to claim 1, wherein the organopalladium compound as Component (C) is palladium acetate.

8. The curable fluorine-containing polyether composition according to claim 1, wherein the basic inorganic compound as Component (D) is potassium phosphate.

9. The curable fluorine-containing polyether composition according to claim 1, wherein the organophosphorus compound as Component (E) is a compound represented by the general formula:

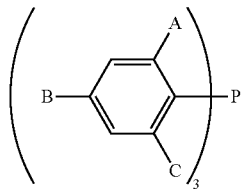

wherein A, B, and C are each independently a hydrogen atom, an alkyl group having 1 to 5 carbon atoms, an alkoxy group or a dialkylamino group, each an alkyl group having 1 to 3 carbon atoms.

10. The curable fluorine-containing polyether composition according to claim 1, wherein the organophosphorus compound as Component (E) is a compound represented by the general formula:

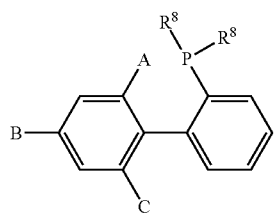

wherein A, B, and C are each independently a hydrogen atom, an alkyl group having 1 to 5 carbon atoms, an alkoxy group or a dialkylamino group, each an alkyl group having 1 to 3 carbon atoms, $R^8$ is a linear or cyclic aliphatic hydrocarbon group having 1 to 6 carbon atoms.

* * * * *